United States Patent [19]

Martin

[11] Patent Number: 4,853,349

[45] Date of Patent: Aug. 1, 1989

[54] GLASS-CERAMICS SUITABLE FOR DIELECTRIC SUBSTRATES

[75] Inventor: Francis W. Martin, Painted Post, N.Y.

[73] Assignee: Corning Glass Works, Corning, N.Y.

[21] Appl. No.: 199,184

[22] Filed: May 26, 1988

[51] Int. Cl.$^4$ ............................................. C03C 10/06
[52] U.S. Cl. ............................................. 501/8; 501/5; 501/70; 501/72; 501/73
[58] Field of Search ..................... 501/5, 8, 70, 73, 72

[56] References Cited

U.S. PATENT DOCUMENTS

| | | | |
|---|---|---|---|
| 4,187,115 | 2/1980 | Reade | 501/8 |
| 4,323,652 | 4/1982 | Baudry et al. | 501/5 X |
| 4,358,541 | 11/1982 | Andrus et al. | 501/8 X |
| 4,714,687 | 12/1987 | Holleran et al. | 501/9 |

FOREIGN PATENT DOCUMENTS 0038972  11/1971  Japan ............................................. 501/8

Primary Examiner—William R. Dixon, Jr.
Assistant Examiner—Karl Group
Attorney, Agent, or Firm—Clinton S. Janes, Jr.

[57] ABSTRACT

This invention is directed to the preparation of two groups of glass-ceramic materials exhibiting properties rendering them especially suitable as substrates for integrated circuit packaging. The first group of materials contains gehlenite, anorthite, and akermanite as the predominant crystal phases and consists essentially, in weight percent of 1–7.25% MgO, 22–40% CaO, 18–36% $Al_2O_3$, and 29–42% $SiO_2$. The second group of materials contains gehlenite, anorthite, and hardystoneite as the predominant crystal phases and consists essentially, in weight percent, of 2–13% ZnO, 22–37.5% CaO, 18–34% $Al_2O_3$, and 28–42% $SiO_2$.

6 Claims, No Drawings

GLASS-CERAMICS SUITABLE FOR DIELECTRIC SUBSTRATES

BACKGROUND OF THE INVENTION

The past decade has witnessed a great surge in research directed toward the development of inorganic materials operable in the fabrication of electronic circuit boards and integrated circuit packaging. For example, glass-ceramic coatings have been devised for application to metal substrates leading to the production of electronic circuit boards, and glass-ceramic substrates for use in integrated circuit packaging have been formulated. A specific goal of the latter compositions has been to replace alumina, the material conventionally used in that application.

The following three patents are illustrative of glass-ceramic coatings for application to metals:

U.S. Pat. No. 4,256,796 discloses compositions consisting essentially, in weight percent, of 16-50% BaO, 16-42% MgO, 12-34% $B_2O_3$, and 10-23% $SiO_2$. CaO, ZnO, $ZrO_2$, $Al_2O_3$, and $SnO_2$ are noted as optional components.

U.S. Pat. No. 4,358,541 reports compositions consisting essentially, in weight percent, of 5-35% MgO, 0-35% CaO, 0-25% ZnO, 10-35% CaO+ZnO, 0-25% $B_2O_3$, 0-10% $P_2O_5$, 4-25% $B_2O_3+P_2O_5$, and 25-50% $SiO_2$. $Al_2O_3$ in an amount up to 10% may be included as an optional ingredient. Where CaO is present in substantial amounts, the predominant crystal phases developed are diopside ($CaO.MgO.2SiO_2$) and akermanite ($2CaO.MgO.2SiO_2$). Where CaO is absent, the predominant crystal phases present are magnesium borate, willemite ($2ZnO.SiO_2$), and enstatite ($MgO.SiO_2$).

U.S. Pat. No. 4,385,127 describes compositions consisting essentially, in weight percent, of 10-60% BaO, 10-35% MgO; 5-30% $B_2O_3$, 25-40% $SiO_2$, and 5-20% CaO+ZnO+$Al_2O_3$, consisting of 0-15% CaO, 0-16% ZnO, and 0-15% $Al_2O_3$.

The following four patents are illustrative of glass-ceramic compositions utilized in substrates for integrated circuit packaging:

U.S. Pat. No. 4,221,047 provides two specific compositions, in weight percent, designed for that application.

| $SiO_2$ | 55.00 | $SiO_2$ | 52.5 |
|---|---|---|---|
| $Al_2O_3$ | 20.56 | $Al_2O_3$ | 21.0 |
| MgO | 20.00 | MgO | 21.5 |
| $AlPO_4$ | 3.44 | $P_2O_5$ | 2.0 |
| $B_2O_3$ | 1.00 | $B_2O_3$ | 1.0 |

Cordierite ($2MgO.2Al_2O_3.5SiO_2$) constituted the predominant crystal phase.

U.S. Pat. No. 4,234,367 also discloses compositions, in weight percent, yielding glass-ceramics having cordierite as the predominant crystal phase.

| $SiO_2$ | 50.6-52.5 | $SnO_2$ | 0-2 |
|---|---|---|---|
| $Al_2O_3$ | 21-22 | $P_2O_5$ | 0-2 |
| MgO | 22-24.2 | $ZrO_2$ | 0-2 |
| $B_2O_3$ | 0.5-2 | | |

U.S. Pat. No. 4,301,324 defines a range of glass-ceramic bodies wherein cordierite comprises the predominant crystal phase, but which also contain clinoenstatite and a secondary phase. Those compositions consisted essentially, in weight percent, of:

| $SiO_2$ | 48-55 | $P_2O_5$ | 0-3 |
|---|---|---|---|
| $Al_2O_3$ | 18-23 | $TiO_2$ | 0-2.5 |
| MgO | 18-25 | $SnO_2$ | 0-2.5 |
| ZnO | 0-2 | $ZrO_2$ | 0-2.5 |
| $Li_2O$ | 0-1 | $TiO_2 + SnO_2 + ZrO_2$ | $\leq 5$ |
| $B_2O_3$ | 0-3 | | |

U.S. Pat. No. 4,714,687 describes glass-ceramic materials containing willemite ($2ZnO.SiO_2$) as the predominant crystal phase and cordierite as a secondary crystal phase. Those materials consisted essentially, in weight percent, of 15-45% ZnO, 3-15% MgO, 10-30% $Al_2O_3$, and 30-55% $SiO_2$.

Finally, U.S. application Ser. No. 42,980, filed Apr. 27, 1987 by L. M. Holleran, J. F. MacDowell and F. W. Martin under the title GLASS-CERAMICS FOR ELECTRONIC PACKAGING, records glass-ceramic materials containing cordierite as essentially the sole crystal phase which consist essentially, in weight percent, of 10-25% MgO+ZnO, consisting of 2-18% MgO+0-21% ZnO, 20-38% $Al_2O_3$, 40-52% $SiO_2$, and 2-15% total of at least one oxide in the indicated proportion of up to 8% total of $K_2O$, $Rb_2O$, and/or $Cs_2O$, up to 10% total of CaO, SrO, BaO, and/or PbO, and up to 5% $B_2O_3$.

As was noted above, one specific goal underlying the research in glass-ceramic compositions for use in integrated circuit packaging has been to replace alumina in that application. A second objective has been to prepare materials demonstrating a coefficient of thermal expansion closely matching that of $Al_2O_3$ ($\approx 65$-$10^{-7}$/°C. over the range 0°-300° C.) for use in such applications as leadless chip carriers. Therefore, the research has been directed to compositions exhibiting the five following characteristics;

(a) compatibility with copper, silver, and gold metallization;

(b) the capability of being co-fired at temperatures below 1000° C. and, desirably, as low as 850° C.;

(c) a dielectric constant less than that of $Al_2O_3$ ($\approx 9$-10 at ambient temperature);

(d) a smooth, flat surface without additional grinding and/or polishing; and (e) a linear coefficient of thermal expansion (25°-800° C.) that can be carefully controlled over the interval of about $50$-$90 \times 10^{-7}$/°C.

SUMMARY OF THE INVENTION

I have found that glass-ceramics demonstrating those characteristics can be prepared from critically-delimited compositions within the CaO-MgO and/or ZnO-$Al_2O_3$-$SiO_2$ system. The materials can be processed into flat sheets, metallized, laminated, and sintered at temperatures below 1000° C. Because of their expected application in integrated circuit packaging, much research activity was directed toward their capability of being formed into thin dielectric sheets through the tape casting of surface-nucleated, thermally-crystallizable glass frits.

The melilite series of minerals has long been known to the geologist. The members of the series have compositions varying from one end member gehlenite ($2CaO.Al_2O_3.SiO_2$) to the other end member akermanite ($2CaO.MgO.2SiO_2$), wherein $MgSiO_3$ replaces $Al_2O_3$ in the gehlenite structure. Synthetic melilites can be formulated, melted, shaped and cooled into glass bodies, and those bodies subsequently crystallized through heat treatment. In an analogous series, the $Al_2O_3$ in the gehlenite structure is replaced with $ZnSiO_3$ to yield end member hardystoneite ($2CaO.ZnO.2SiO_2$). That series can likewise be synthetically formulated, melted, shaped and cooled into glass bodies, and those bodies subsequently crystallized through heat treatment. Laboratory experience also demonstrated that glasses of both series in powder form exhibited good sintering characteristics in the glassy state before crystallization occurred, thereby indicating their ready capability of being processed into thin sheets through tape casting. The linear coefficients of thermal expansion (25°–800° C.) manifested by those materials are greater than $90 \times 10^{-7}$/°C., considerably higher than that of silicon ($\approx 35 \times 10^{-7}$/°C.) and gallium arsenide ($\approx 60 \times 10^{-7}$/°C.) and, hence, rendering them impractical for use with chips or wafers of those materials.

I discovered, however, and it is upon this discovery that the present invention is founded, that where a base composition consisting of blends of gehlenite and akermanite or gehlenite and hardystoneite are treated with varying amounts of anorthite ($2CaO.Al_2O_3.2SiO_2$), a series of compositions can be obtained which can be melted, shaped and cooled into glass bodies, and those glass bodies subsequently crystallized in situ at temperatures below 1000° C. to produce materials demonstrating linear coefficients of thermal expansion (25°–800° C.) between about $50-90 \times 10^{-7}$/°C. The glasses sinter well in powder form before crystallization thereof occurs. X-ray diffraction analyses of the crystallized bodies have indicated the presence of each of the three crystal phases in the approximate proportions as comprising the original glass compositions.

As can be appreciated, the addition of any finite amount of anorthite to the gehlenite-akermanite and gehlenite-hardystoneite mixtures will exert an impact upon the coefficient of thermal expansion. Nevertheless, from a practical point of view, an addition of anorthite in an amount equivalent to about 5% by volume has been deemed a minimum to have a significant influence on the coefficient of thermal expansion. On the other hand, to take advantage of the excellent melting, forming, and sintering characteristics of the base two-component mixtures, an amount of anorthite equivalent to about 90% has been considered a practical maximum. Accordingly, then, expressed in terms of weight percent on the oxide basis, the operable compositions within the gehlenite-akermanite-anorthite series will consist essentially of about 1–7.25% MgO, 22–40% CaO, 18–36% $Al_2O_3$, and 29–42% $SiO_2$. Operable compositions within the gehlenite-hardystoneite-anorthite series, expressed in terms of weight percent on the oxide basis, will consist essentially of about 2–13% ZnO, 22–37.5% CaO, 18–34% $Al_2O_3$, and 28–42% $SiO_2$.

The smaller alkali metal oxides $Li_2O$, $Na_2O$, and $K_2O$ will preferably be essentially free from the compositions due to their adverse effect upon the electrical properties of the final crystalline product. To insure that the desired properties are developed in the inventive materials, the total of all extraneous components, including such oxides as SrO, BaO, PbO, and $Cs_2O$, will preferably be held below 5%.

DESCRIPTION OF PREFERRED EMBODIMENTS

Table I recites a number of precursor, thermally-crystallizable glass compositions, expressed in terms of parts by weight on the oxide basis, illustrating the glasses of the instant invention which, upon heat treatment, will crystallize in situ to materials containing the crystal phases gehlenite, akermanite, and anorthite. Because the sum of the individual components totals or very closely approximates 100, for all practical purposes the values listed may be considered to reflect weight percent. Table I also records the proportions of gehlenite (Geh), akermanite (Ake), and anorthite (Ano) comprising the original precursor glass batch, as calculated. Finally, Table I reports the linear coefficient of thermal expansion (Exp) over the temperature range of 25°–800° C., expressed in terms of $\times 10^{-7}$/°C., exhibited by the crystallized products.

Table II recites, in like manner to Table I, a group of precursor thermally-crystallizable glass compositions, expressed in terms of parts by weight on the oxide basis, illustrating the glasses of the instant invention but which, upon heat treatment, will crystallize in situ to materials containing the crystal phases gehlenite, hardystoneite, and anorthite, along with the proportions of gehlenite (Geh), hardystoneite (Har), and anorthite (Ano) present, as calculated from the glass batch, and the linear coefficient of thermal expansion (Exp) over the temperature range of 25°–800° C. exhibited by the crystallized products.

The actual batch ingredients for the glasses of Table I and Table II can comprise any materials, either oxides or other compounds, which, when melted together, will be converted into the desired oxide in the proper proportions. The constituents for each of the compositions listed in Tables I and II were compounded, ballmilled together to aid in obtaining a homogeneous melt, charged into platinum crucibles, and lids placed on the crucibles. The crucibles were introduced into a furnace operating at a temperature of about 1650° C., and the batches were melted for about 6 hours. The melts were then poured into steel molds to yield glass slabs having dimensions of about $8'' \times 4'' \times 0.5''$ and those slabs were immediately transferred to an annealer operating at about 700° C. Casting of the melts into slabs allows for inspection of glass quality. In another procedure the melts were poured as a thin stream into a bath of tap water, a practice termed "drigaging" in the glass art. The resulting glass particles were then dried and comminuted to a predetermined grain size.

Whereas the exemplary compositions presented in Tables I and II were prepared in the laboratory, it must be appreciated that those compositions could be scaled up to be used in commercial, large-scale glassmaking facilities. Furthermore, whereas no fining agent, such as $As_2O_3$ and/or $Sb_2O_3$, was utilized in the laboratory melts, an inclusion of a fining agent may be helpful in securing optimum glass quality in commercial production.

TABLE I

|  | 1 | 2 | 3 | 4 | 5 | 6 | 7 | 8 |
| --- | --- | --- | --- | --- | --- | --- | --- | --- |
| MgO | 7.4 | 4.9 | 3.7 | 1.5 | 4.9 | 3.9 | 2.9 | 1.9 |
| CaO | 41.0 | 34.0 | 30.6 | 24.3 | 41.0 | 36.7 | 32.6 | 28.4 |
| $Al_2O_3$ | 18.7 | 24.7 | 27.7 | 33.1 | 24.9 | 27.3 | 29.6 | 32.0 |
| $SiO_2$ | 32.9 | 36.3 | 38.0 | 41.2 | 29.3 | 32.1 | 34.9 | 37.7 |
| Geh | ⅓ | ⅓ | ⅓ | .1 | ⅔ | .533 | .4 | .266 |
| Ake | ⅓ | ⅓ | ⅓ | .1 | ⅓ | .266 | .2 | .133 |

TABLE I-continued

|     | 1    | 2    | 3    | 4    | 5    | 6    | 7    | 8    |
|-----|------|------|------|------|------|------|------|------|
| Ano | 0    | ¼    | ¼    | .8   | 0    | .2   | .4   | .6   |
| Exp | 95.5 | 85.3 | 76.4 | 57.0 | 90.6 | 82.9 | 74.4 | 64.9 |

TABLE II

|        | 9    | 10   | 11   | 12   | 13   | 14   | 15   | 16   |
|--------|------|------|------|------|------|------|------|------|
| ZnO    | 13.9 | 9.4  | 7.1  | 9.4  | 7.6  | 5.7  | 3.9  | 0    |
| CaO    | 38.1 | 32.4 | 29.4 | 39.0 | 35.3 | 31.6 | 27.8 | 20.1 |
| $Al_2O_3$ | 17.4 | 23.6 | 26.8 | 23.7 | 26.2 | 28.8 | 31.4 | 36.7 |
| $SiO_2$ | 30.6 | 34.7 | 36.7 | 27.9 | 30.8 | 33.9 | 36.9 | 43.2 |
| Geh    | ¼    | ¼    | ¼    | ⅔    | .533 | .4   | .266 | 0    |
| Har    | ¼    | ¼    | ¼    | ⅓    | .266 | .2   | .133 | 0    |
| Ano    | 0    | ¼    | ¼    | 0    | .2   | .4   | .6   | 1    |
| Exp    | 93.2 | 79.6 | 70.4 | 91.3 | 81.7 | 72.9 | 64.3 | 47.6 |

The sintering capability of the above examples was explored according to the following procedure. Test samples were prepared by comminuting the glass slabs and drigaged materials to frits wherein the particles passed No. 200 United States Standard Sieve (74 microns), mixing that frit with a small quantity of a liquid organic binder/vehicle, pressing that mixture into button-shaped discs having a diameter of about 1.27 cm and a height of about 0.635 cm, and then firing those discs at temperatures of about 915° C. for about two hours. Each of the glass discs, except that of Example 16 (consisting solely of anorthite), shrunk to a diameter of about 1-1.05 cm with rounded corners, thereby indicating good sintering.

Bars having dimensions of about 4"×0.25"×0.25" were dry pressed from glass frit also passing a No. 200 United States Standard Sieve. The bars were crystallized in situ by firing at 980° C. for two hours. Those bars comprised the samples upon which the linear coefficients of thermal expansion were measured.

It is well known in the art to prepare multi-layer, inorganic integrated circuit packages by laminating together, through sintering, a plurality of individual circuit plies, wherein each ply comprises a patterned, electrically conductive layer and through hole connectors, termed vias, bored in the ply for connecting the patterned electrically conductive layers of the respective plies to form a predetermined wiring circuit. Generally, the individual plies will be cut from tapes prepared from very finely-divided particles of inorganic material bonded together through an organic binder. Accordingly, the typical practice for preparing those packages has comprehended the following four elements:

(a) holes are punched in the tapes for the connectors;
(b) the electrically conductive layers are screened onto the tape;
(c) a predetermined number of tapes are laid up or laminated together with the vias in proper registry; and
(d) the laminate is sintered together.

To simulate that practice, Examples 2 and 3 were fabricated into tapes following the procedure below:

Drigaged glass particles were ballmilled for about 24 hours using balls of $Al_2O_3$ to subdivide the particles to diameters of less than 10 microns. The resulting powder was mixed with an organic vehicle in a ballmill for 24 hours to yield a solids:organic vehicle weight ratio of 3:2. The organic vehicle consisted of a binder (polyvinyl butyral), a solvent (toluene), and a surfactant (phosphate ester). That slurry was applied at a thickness of about 0.005-0.02" onto a polyester film utilizing a doctor blade, and dried in air at about 25° C. to evaporate the organic liquids. The resultant tape was cut into sheets having dimensions of about 3"×3" and 6-8 of those sheets were laid up in a stack. The stack was fired at 950°-980° C. for 2 hours to sinter the sheets into an integral composite laminate having a thickness of about 0.040-0.060". That lamination firing had the further function of simultaneously crystallizing the glass particles in situ, thereby producing a glass-ceramic body operable as a substrate for integrated circuit packaging.

Table III reports several physical properties determined on those laminates employing measuring techniques conventional in the ceramic art. Density (Den.) is recorded in terms of $g/cm^3$; modulus of rupture (MOR) is listed in terms of ksi; linear coefficient of thermal expansion (Exp.) over the range of 25°-300° C. is tabulated in terms of $\times 10^{-7}/°C.$; dielectric constant (D.C.) is reported at room temperature and 100 KHz; dissipation factor (D.F.) is given at room temperature and 100 KHz; and electrical resistivity (Log $\rho$) is cited at room temperature.

TABLE III

| Example | Den. | MOR | Exp. | D.C. | D.F. | Log $\rho$ |
|---------|------|-----|------|------|------|-----------|
| 2       | 2.74 | 19  | 81   | 7.4  | 0.4% | >13       |
| 3       | 2.79 | 20  | 64   | 7.8  | 0.2% | >12       |

I claim:

1. A glass-ceramic body exhibiting a dielectric constant less than that of $Al_2O_3$, a linear coefficient of thermal expansion (25°-800° C.) between about $50-90\times 10^{-7}/°C.$, and containing gehlenite, anorthite, and akermanite as the predominate crystal phases, said body having a composition essentially free from $Li_2O$, $Na_2O$, and $K_2O$ and consisting essentially, expressed in terms of weight percent on the oxide basis, of about 1-7.25% MgO, 22-40% CaO, 18-36% $Al_2O_3$, and 29-42% $SiO_2$.

2. A glass-ceramic body according to claim 1 wherein anorthite is present in an amount between 5-90% by volume.

3. A glass-ceramic body exhibiting a dielectric constant less than that of $Al_2O_3$, a linear coefficient of thermal expansion (25°-800° C.) between about $50-90\times 10^{-7}/°C.$, and containing gehlenite, anorthite, and hardystoneite as the predominant crystal phases, said body having a composition essentially free from $Li_2O$, $Na_2O$, and $K_2O$ and consisting essentially expressed in terms of weight percent on the oxide basis, of about 2-13% ZnO, 22-37.5% CaO, 18-34% $Al_2O_3$, and 28-42% $SiO_2$.

4. A glass ceramic body according to claim 3 wherein anorthite is present in an amount between about 5-90% by volume.

5. A substrate for integrated circuit packaging comprising a glass-ceramic material exhibiting a dielectric constant less than that of $Al_2O_3$, a linear coefficient of thermal expansion (25°-800° C.) between about $50-90\times 10^{-7}/°C.$, and containing gehlenite, anorthite, and akermanite as the predominant crystal phases, said material having a composition essentially free from $Li_2O$, $Na_2O$, and $K_2O$ and consisting essentially, expressed in terms of weight percent on the oxide basis, of about 1-7.25% MgO, 22-40% CaO, 18-36% $Al_2O_3$, and 29-42% $SiO_2$.

6. A substrate for integrated circuit packaging comprising a glass-ceramic material exhibiting a dielectric constant less than that of $Al_2O_3$, a linear coefficient of thermal expansion (25°–800° C.) between about 50–90×10$^{-7}$/°C., and containing gehlenite, anorthite, and hardystoneite as the predominant crystal phases, said material having a composition essentially free from Li$_2$O, Na$_2$O, and K$_2$O and consisting essentially, expressed in terms of weight percent on the oxide basis, of about 2–13% AnO, 22–37.5% CaO, 18–34% Al$_2$O$_3$, and 28–42% SiO$_2$.

* * * * *